United States Patent [19]

Weinberg

[11] Patent Number: 5,856,915

[45] Date of Patent: Jan. 5, 1999

[54] VERTICALLY STACKED CIRCUIT MODULE USING A PLATFORM HAVING A SLOT FOR ESTABLISHING MULTI-LEVEL CONNECTIVITY

[75] Inventor: Alvin H. Weinberg, Moorpark, Calif.

[73] Assignee: Pacesetter, Inc., Sylmar, Calif.

[21] Appl. No.: 806,814

[22] Filed: Feb. 26, 1997

[51] Int. Cl.[6] .............................. H01R 23/72; H01R 9/09; H05K 1/14

[52] U.S. Cl. ......................... 361/790; 257/686; 361/735; 361/803

[58] Field of Search .................................. 174/52.2–52.4; 257/686, 700, 723, 724, 777; 361/735, 744, 760, 784, 790, 791, 803, 804; 439/68, 70, 69, 74, 75; 438/401, 456, 617, 369

[56] References Cited

U.S. PATENT DOCUMENTS

| 5,157,588 | 10/1992 | Kim et al. . | |
|---|---|---|---|
| 5,172,303 | 12/1992 | Bernardoni et al. . | |
| 5,198,888 | 3/1993 | Sugano et al. . | |
| 5,222,014 | 6/1993 | Lin . | |
| 5,373,189 | 12/1994 | Massit et al. | 257/686 |
| 5,723,907 | 3/1998 | Akram | 257/723 |
| 5,742,477 | 4/1998 | Baba | 257/686 |

FOREIGN PATENT DOCUMENTS

| 55-61046 | 5/1980 | Japan . | |
|---|---|---|---|
| 56-40268 | 4/1981 | Japan . | |
| 59-44851 | 3/1984 | Japan . | |
| 59-44852 | 3/1984 | Japan . | |
| 60-10764 | 1/1985 | Japan . | |
| 60-22352 | 2/1985 | Japan | 257/686 |
| 60-38844 | 2/1985 | Japan . | |
| 60-117763 | 6/1985 | Japan . | |
| 62-260353 | 11/1987 | Japan . | |
| 63-128736 | 6/1988 | Japan | 257/686 |
| 63-12876 | 6/1988 | Japan . | |
| 128855 | 1/1989 | Japan . | |
| 189356 | 4/1989 | Japan . | |
| 1147850 | 6/1989 | Japan . | |
| 1286353 | 11/1989 | Japan . | |
| 6-151702 | 5/1994 | Japan | 257/723 |

*Primary Examiner*—Donald Sparks

[57] ABSTRACT

A circuit module for use in an implantable cardiac stimulation device contains a plurality of stacked substrate platforms. Electrical components of a hybrid circuit structure are attached to respective mounting surfaces of the substrate platforms. Electrical connectivity between components mounted on separate platform levels is established by connecting the components via wire bonds or other means. The wire bonds pass through a slot formed in an upper level substrate and are attached to electrical contacts of an associated lower level substrate.

22 Claims, 3 Drawing Sheets

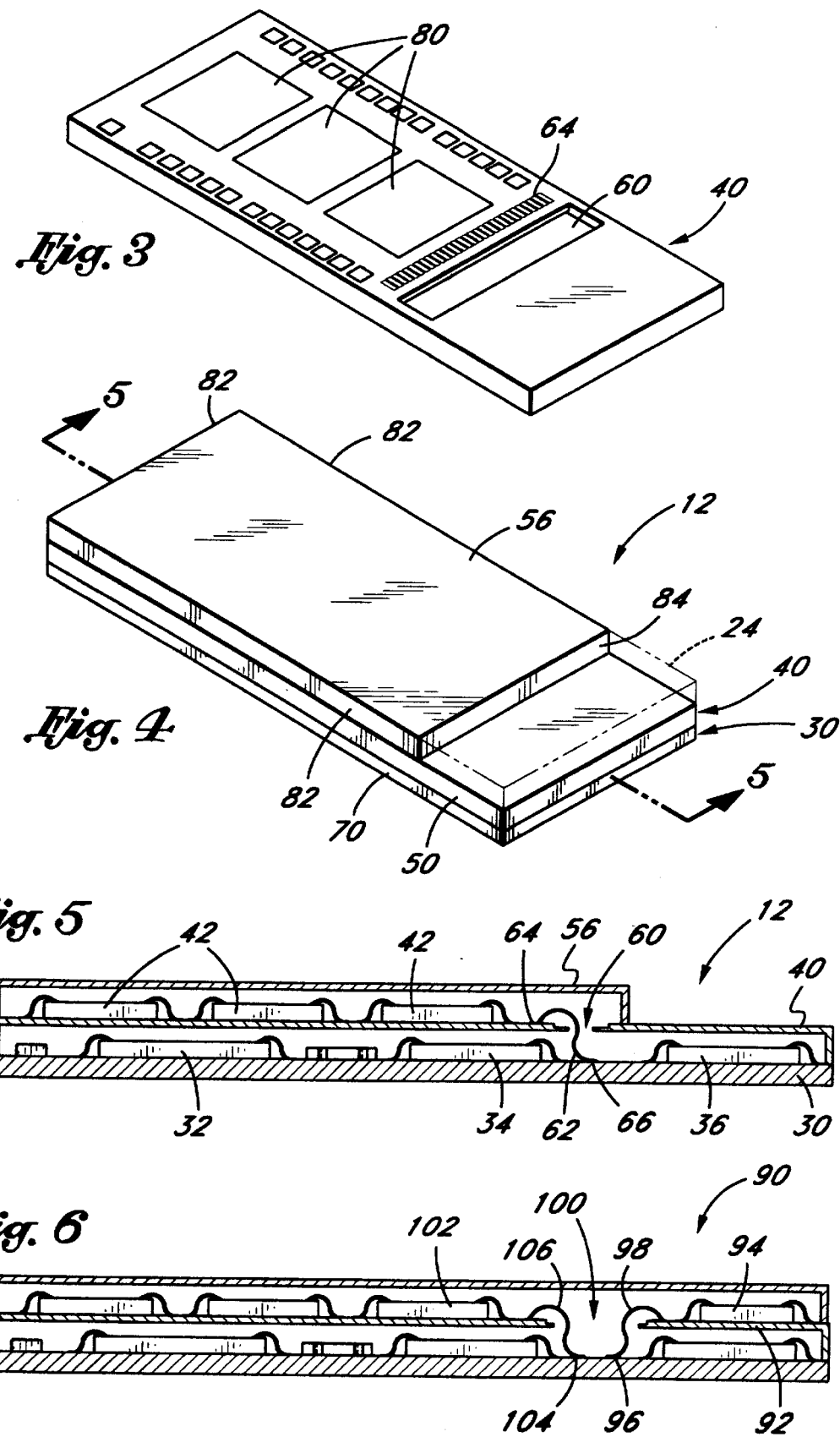

VERTICALLY STACKED CIRCUIT MODULE USING A PLATFORM HAVING A SLOT FOR ESTABLISHING MULTI-LEVEL CONNECTIVITY

FIELD OF THE INVENTION

This invention relates generally to methods and apparatus for configuring high density multi-level circuit structures. More particularly, this invention relates to methods and apparatus for configuring and interconnecting multi-level hybrid circuit structures situated within a cardiac stimulation device.

BACKGROUND OF THE INVENTION

As cardiac stimulation devices become more technologically complex, it has become challenging to reduce their overall size or even maintain their existing size. Reducing the size of a cardiac stimulation device benefits the patient who must carry the device, and it may also lead to an improved procedure for implanting the device. Accordingly, there are continuous efforts within the medical device industry to reduce the size of pacemakers, defibrillators and other implantable medical devices.

Cardiac stimulation devices typically contain, among other components, an outer casing which houses an electronics module, a battery, various interconnection circuitry, and stimulus leads for attachment to a patient's heart. The electronics module of such cardiac stimulation devices is often a multi-level hybrid circuit structure. The multi-level module is ordinarily designed to achieve a low-volume configuration to facilitate placement within the limited confines of an associated housing. Multi-level circuit modules may contain separate vertically stacked substrates, i.e., platforms, having individual circuit components mounted on the substrates. A protective cover, or lid, is typically placed over any exposed electronic circuitry of the multi-level module.

Depending upon the particular design, multi-level modules found in cardiac stimulation devices, or other suitable devices, may require interconnection among components or terminals of different platform levels. The interconnection among components of different levels may be made through miniature wire-bonds attached to individual contacts. To achieve interconnection among various platform levels, it is common to design the various platforms of different size so that the wire bonds may extend over an edge of one platform in order to contact a surface of a second platform.

There have been many approaches documented in prior art publications for constructing a multi-layer or three-dimensional circuit module. For example, in U.S. Pat. No. 5,222,014 issued to Lin, and Japanese publication No. 1-147850 issued to Kuwabara, independent circuit platforms are stacked above a substrate and interconnected through solder joints or wire-bonds. In each case a lid may be placed over the structure to protect the underlying circuitry. In such prior art circuit structures, the interconnection among various platform levels is made by extending a wire-bond, or other connection means, over an edge of a higher platform to a lower platform level. One drawback to this method of interconnection is the need for platform levels of successively smaller surface area. For example, in Japanese publication No. 62-260353 issued to Yoshida, individual platform levels are placed on top of one another for achieving a stacked semiconductor device. However, because each stacked platform of the device in Yoshida decreases in size, a successively smaller surface area is available on each of the stacked platforms.

A second drawback of the device in Yoshida, and other devices found in the prior art, is the requirement that all multi-level connections be made about an outside perimeter of a particular platform level. This requirement limits the design constraints with respect to component layout which in some cases may lead to a less than optimal configuration of components atop the platform levels.

Therefore, there is a need in the art for an improved pacemaker design which allows for the packaging of internal electrical components to optimize use of multi-level surface area. There is also a need in the art for an improved multi-level circuit structure module which allows for greater flexibility in the design of electrical component layout.

SUMMARY OF THE INVENTION

In accordance with a preferred embodiment of the present invention, a multi-level circuit structure for use in a cardiac stimulation device, or other suitable device, contains separate platform substrates stacked in a vertical fashion. A first, or lower, substrate of the circuit structure contains individual electronic components and electrical contact surfaces. A second, or upper, substrate is mounted on a top surface of the lower substrate. Additional electronic components are mounted on a top surface of the second substrate. Electrical connectivity is established between individual components, or individual contacts, placed on the first and second substrates through attachment of wire bonds which pass through an aperture formed within the second substrate. A protective lid is attached to the surface of the second substrate to protect the underlying components. Greater chip packing density and improved flexibility is achieved through interconnection of the substrate layers via the aperture.

BRIEF DESCRIPTION OF THE DRAWINGS

The above and other aspects, features and advantages of the present invention will be more apparent from the following particular descriptions thereof presented in conjunction with the following drawings wherein:

FIG. 3 is a perspective view of the second layer substrate used for constructing a vertically stacked circuit module in accordance with a preferred embodiment.

FIG. 4 is a perspective view of an assembled vertically stacked circuit module in accordance with a preferred embodiment.

FIG. 5 is a cross-section view of the circuit module of FIG. 4 taken along the line 5—5.

FIG. 6 is cross-section view of an alternative embodiment of a vertically stacked circuit module.

DETAILED DESCRIPTION OF THE PREFERRED EMBODIMENT

Figure 1:
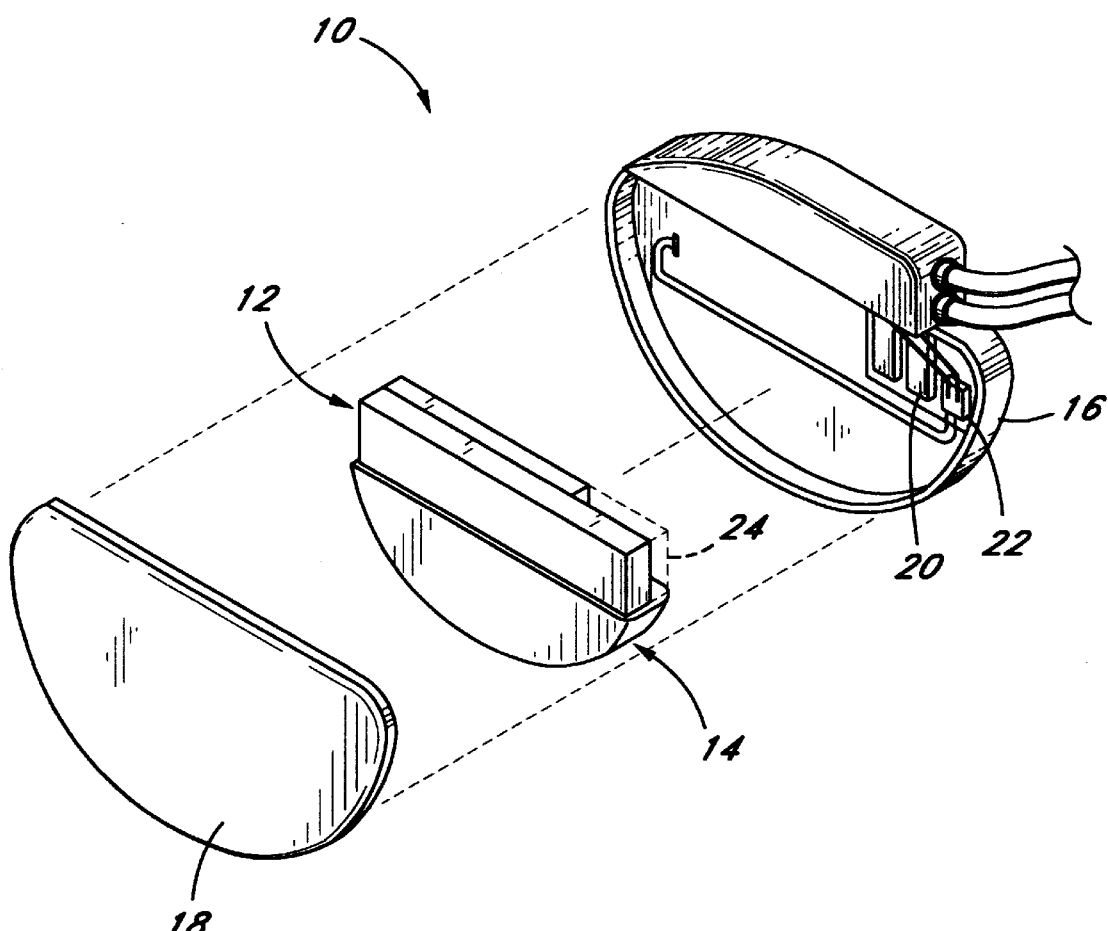
FIG. 1 is a perspective view of a partially disassembled cardiac stimulation device having a vertically stacked circuit module using a platform having a slot for establishing multi-level connectivity.

Referring initially to FIG. 1, an implantable pacemaker device 10 is shown constructed in accordance with the present invention. The pacemaker 10 has an electronics circuit module 12 positioned next to a battery 14. The module 12 and the battery 14 are placed within the confines of a pacemaker housing comprised of a first piece 16 and a second piece 18 which fit together. Additional electrical components, such as an activity sensor 20 and a resistor board 22, are mounted to the interior of the housing piece 16. Upon assembly of the pacemaker 10, the sensor 20 and resistor board 22 are placed to coincide with the region 24 (denoted in dashed lines) next to the circuit module 12. The pacemaker 10 is a surgically implantable unit designed to monitor cardiac activity and regulate cardiac arrhythmias. Basic construction and operational functions of a typical cardiac pacemaker are common to one of ordinary skill in the art and will not be discussed in detail in accordance with a preferred embodiment of the invention.

Figure 2:
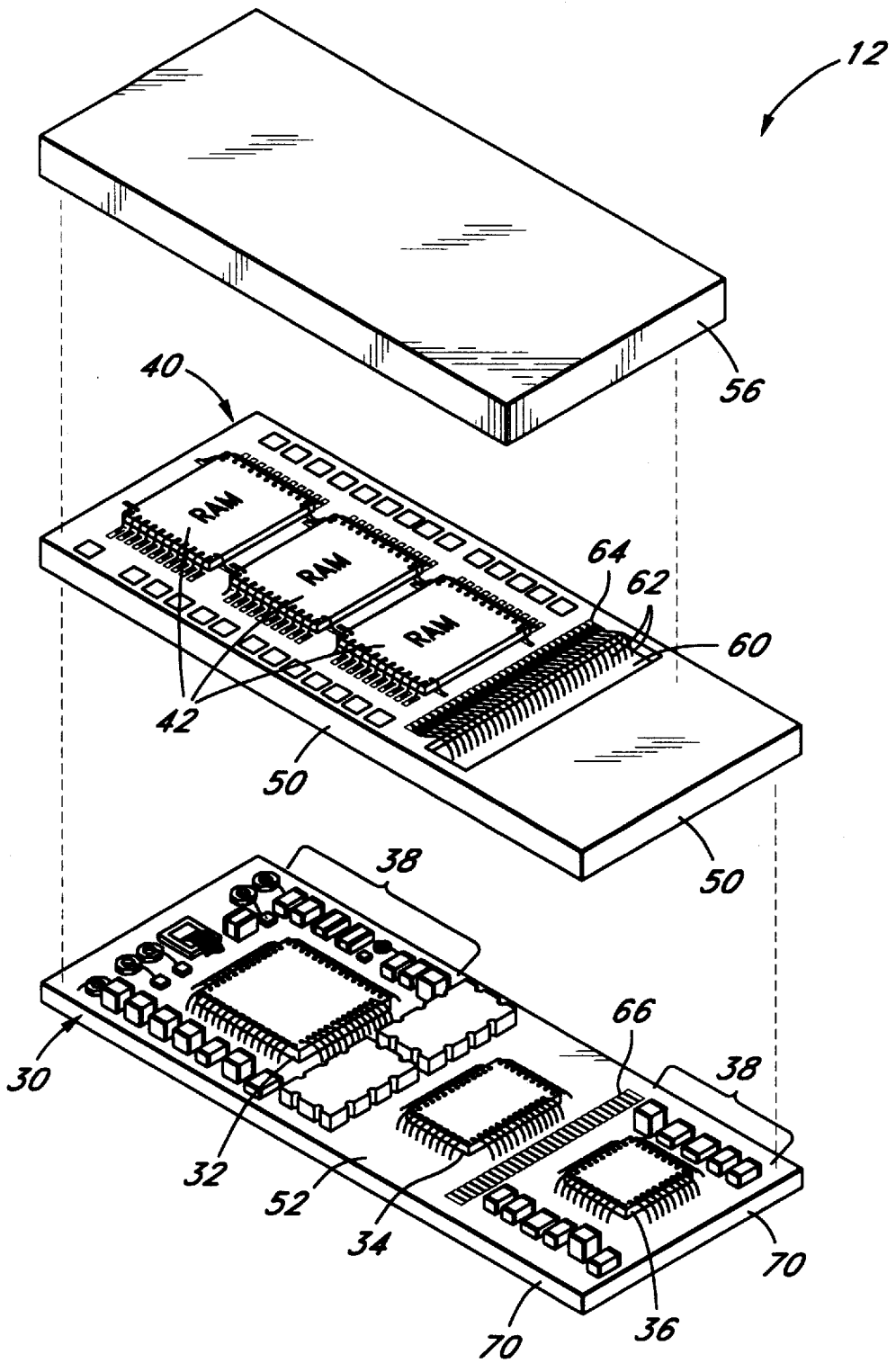
FIG. 2 is a perspective view of a partially disassembled vertically stacked circuit module constructed in accordance with a preferred embodiment.

Construction of the novel circuit module 12 can be seen in FIG. 2 which depicts the various levels of the circuit module before final assembly. Referring now to FIG. 2, the module 12 has a main, or lower, substrate 30 upon which are mounted various electronic components of a hybrid circuit structure. The substrate 30 contains integrated circuit components 32, 34, and 36 and surrounding circuit components, collectively 38. The module 12 contains a second, or upper, substrate 40 which rests upon the substrate 30 and acts as a cover for the underlying components 32, 34, 36, and 38. The upper substrate 40 also contains a group of integrated circuit components 42 which in FIG. 2 are depicted as random access memory (RAM) chips. Additional electronic components may be placed on the surface of the substrate 40 around the components 42. The particular type of electronic components placed on either of the substrates 30 or 40 may vary depending on the design of the module and those shown in FIG. 2 exemplify one possible configuration.

The substrate 40 is formed as a raised platform having exterior edges 50 acting as platform supports which rest upon a top surface 52 of the substrate 30 near its periphery. When attached together, the two substrates 30 and 40 create a multi-level hybrid circuit structure used in the pacemaker 10. A bottom surface of the substrate 40 rests above the substrate 30 at a height determined by the height of the edge supports 50. A protective cover, or lid, 56 is placed over the top substrate 40 to fully enclose and seal the underlying components mounted on the second substrate 40. In a preferred embodiment, the surface 52 of the first substrate 30 is in fluid communication with the components 42 via the aperture 60. Accordingly, the cover 56 serves to protect the components 32, 34, 36 and 38 of the first substrate 30 as well. If desired, the aperture 60 may be "filled in" with a nonconductive material to provide segregation of the components mounted on the lower and upper substrates 30 and 40.

To establish electrical communication between components of the upper substrate 40 and components of the substrate 30, an aperture 60, or slot, is formed in the upper substrate 40. Individual wire bonds 62 are attached to a series of contacts 64 mounted on the substrate 40. The wire bonds 42 extend through the slot 60 for attachment to a corresponding series of contacts 66 mounted on the substrate 30. Use of wire bonds to connect miniature electronic components is often used in pacemaker designs and such methods are common to one of ordinary skill in the relevant art.

Use of the slot 60 to establish multi-level connectivity offers distinct advantages over methods found in the prior art. For example, because connectivity is established through the slot 60, upper level substrate platforms can be constructed of the same proportions of the underlying substrate 30. In this manner, the edges 50 of the substrate 40 coincide with edges 70 of the substrate 30 upon assembly. Without use of the slot 60 to establish multi-level connectivity, upper level platform substrates would be characterized by successively smaller dimensions. The multi-level substrate structure disclosed in publication 61-105324 issued to Yoshida is an example of a prior art multi-level semiconductor containing stacked platforms of successively smaller dimensions.

In addition to maintaining consistent platform dimensions, the present invention offers improved module design flexibility over the prior art. Specifically, with the use of the slot 60, more freedom is obtained with respect to design layout of components on a particular substrate. Through the formation of a slot, or slots, certain components or their associated contacts need not be situated near an outer periphery to establish multi-level connectivity. This can be a distinct advantage when configuring micro-architecture circuit structures on a limited surface area.

FIG. 3 is a perspective view of the upper platform substrate 40 shown in FIG. 2 before attachment of any surface level components. In FIG. 3, the slot 60 of the substrate 40 is clearly shown for establishing connectivity between contacts 64 and the lower level substrate 30. The substrate 40 also contains areas 80 for receiving semiconductor or other electrical components. Although the substrate 40 is shown with a single rectangular slot 60, it can be appreciated that various aperture shapes and sizes positioned at various locations of the substrate 40 can be used to achieve multi-level connectivity. The size and number of particular slots used for connectivity purposes will be dictated by particular design constraints of the entire module 12.

FIG. 4 is a perspective view of the assembled module 12 suitable for placement in the pacemaker housing 16 (shown in FIG. 1). As shown in FIG. 4, the cover 56 is smaller that the underlying substrate 40. Specifically, the rectangular cover 56 has three edges 82 which coincide with the edges 50 of the substrate 40. The region 24 (shown in dashed lines) resides at one end of the module 12 and is partially defined by the substrate 40 and a fourth edge 84 of the cover 56. As discussed in connection with FIG. 1, the region 24 accommodates additional electrical components 20 and 22 of the pacemaker 10.

Use of the slot 60 in connection with the pacemaker design having the region 24 offers yet another advantage over the prior art. More specifically, referring now to FIGS. 3 and 4, if the substrate 40 were designed without the slot 60, the substrate 40 would be shorter in length than the substrate 30 in order to establish multi-level connectivity over a peripheral edge. Accordingly, the area of the substrate 30 beneath the region 24 would remain exposed. Thus, to cover the components mounted on the substrates 30 and 40, and to maintain the region 24, a multi-level cover would be required that attaches directly to the substrate 40 and directly to an otherwise exposed portion of the substrate 30 beneath the region 24. However, such a multi-level cover for use in a pacemaker module may be undesirable in some instances.

For example, circuit structures such as the multi-level modules found in pacemaker devices may be subject to temperature fluctuations during operation. These temperature fluctuations can have a small bending or warping effect on the substrates 30 and 40. Accordingly, such circuit structures undergo temperature cycling tests to ensure thermal stress tolerances are acceptable. In the case of a multi-level circuit module of a pacemaker, the substrates of the various platforms may be made of ceramic or other suitable material, while the protective lid is typically made of a plastic material. The thermal expansion characteristics of ceramic differs from that of plastic. Therefore, attaching an integrated plastic lid to separate ceramic platform levels, such as the substrates 30 and 40, may create uneven stress forces during thermal expansion. As a result, it may undesirable to use a plastic lid which attaches to both the substrate 30 and the substrate 40. Thus, use of an upper level substrate having a slot for establishing multi-level connectivity can be seen to have distinct advantages over the prior art because it allows for use of a protective cover which resides in a single elevational plane and which attaches to only one substrate.

FIG. 5 depicts the module 12 as seen along the line 5—5 of FIG. 4. In accordance with a preferred embodiment, components of the lower level substrate 30 are electrically interconnected with components of the upper level substrate 40 via wire bonds 62. The wire bonds 62 extend through the slot 60 and terminate at surface level contacts 66. Alternatively, the wire bonds 62 may be routed to specific individual electrical components instead of surface mounted contacts 64 and 66.

FIG. 6 depicts a cross section of an alternative embodiment of a vertically stacked circuit module 90. The module 90 has a second layer substrate 92 which contains an integrated circuit 94 mounted on the surface. In the alternative embodiment 90, the region which previously accommodated components 20 and 22 (shown in FIG. 1) is used for the placement of additional module circuitry. The integrated circuit 94 is connected to lower level contacts 96 via wire bonds 98 which pass through a slot 100. Similarly, an integrated circuit 102 is connected to lower level contacts 104 via wire bonds 106 which also pass through the slot 100.

Finally, although the preceding description of the preferred and alternative embodiments has been demonstrated to be advantageous for pacemaker designs, the same principles can be applied for any implantable cardiac stimulation device such as a defibrillator or the like.

Through the foregoing description and accompanying drawings, the present invention has been shown to have important advantages over current apparatus and methods for constructing a multi-level circuit module. While the above detailed description has shown, described, and pointed out the fundamental novel features of the invention, it will be understood that various omissions, substitutions and changes in the form and details of the device and methods illustrated may be made by those skilled in the art, without departing from the spirit of the invention. Therefore, the invention should be limited in its scope only by the following claims.

What is claimed is:

1. A cardiac stimulation device for monitoring the heart activity of a patient upon surgical implantation of the cardiac stimulation device within the patient, the cardiac stimulation device comprising:
a housing containing a battery and a vertically stacked electronics module for monitoring cardiac activity of the patient, the electronics module comprising:
a lower level substrate having a first electrical component mounted on a top surface thereon;
an upper level substrate raised above and attached to the lower level substrate and having a top surface with a second electrical component mounted thereon, the upper level substrate having a bottom surface covering the first electrical component; and
a plurality of wire bonds electrically connecting the first and second electrical components of the lower and upper level substrates wherein the plurality of wire bonds are disposed within an aperture formed through the upper level substrate.

2. The cardiac stimulation device of claim 1, further comprising a protective cover attached to the upper level substrate, wherein the lower level substrate, the upper level substrate and the protective cover each reside within a separate reference plane to achieve a substantially uniform thermal expansion of the lower and upper level substrates during temperature fluctuations.

3. The cardiac stimulation device of claim 1, wherein the plurality of wire bonds comprises a plurality of wire bonds connected between a plurality of contacts associated with the first electrical component and a corresponding plurality of contacts associated with the second electrical component.

4. The cardiac stimulation device of claim 1, further comprising a third substrate attached to the upper level substrate, the third substrate having an aperture formed therethrough and comprising a plurality of wire bonds disposed through the third substrate aperture for establishing electrical continuity between a third electrical component mounted on the third substrate and a fourth electrical component mounted on the upper level substrate.

5. The cardiac stimulation device of claim 1, wherein the first electrical component is an integrated circuit and the second electrical component is a discrete electrical component.

6. The cardiac stimulation device of claim 1, further comprising a cover attached to the upper level substrate for confining the first and second electrical components.

7. The cardiac stimulation device of claim 6, wherein the cover is made of plastic.

8. A cardiac stimulation device for monitoring the heart activity of a patient upon surgical implantation of the cardiac stimulation device within the patient, the cardiac stimulation device comprising:
a housing containing a battery and a vertically stacked electronics module for monitoring cardiac activity of the patient, the electronics module comprising:
a first substrate platform having a first plurality of electronic components mounted on a top surface thereon;
a second substrate platform raised above and attached to the first substrate platform and formed with at least one aperture therethrough, the second substrate platform having a bottom surface covering the first plurality of components and having a second plurality of electronic components mounted on a top surface thereon; and
wire bonds traversing the at least one aperture for establishing electrical connectivity between at least one component of the first plurality of electronic components and at least one component of the second plurality of electronic components.

9. The cardiac stimulation device of claim 8, wherein the at least one aperture of the second substrate platform is an elongated slot.

10. The cardiac stimulation device of claim 8, wherein the at least one aperture comprises a plurality of slots.

11. The cardiac stimulation device of claim 8, wherein:
the first substrate platform includes a first group of contacts mounted on the top surface of the first substrate platform;
the second substrate platform includes a second group of contacts mounted on the top surface of the second substrate platform; and
the wire bonds include a plurality of wire bonds electrically connecting respective pairs of contacts from the first group of contacts to the second group of contacts.

12. The cardiac stimulation device of claim 8, further comprising a protective cover attached to the second substrate platform, the protective cover having an attachment surface for adhering to the second platform wherein the attachment surface is in a single elevational plane.

13. The cardiac stimulation device of claim 12, wherein the first substrate platform, the second substrate platform and the protective cover each reside wholly within separate elevational planes.

14. An electronics module for use in a cardiac stimulation device wherein the electronics module is mounted within a housing of the cardiac stimulation device, said electronics module comprising:

a first substrate having a first group of electronic components mounted on a surface of the first substrate, the first substrate having a first set of contacts in electrical communication with the first group of electronic components;

a second substrate formed as a raised platform having exterior edges acting as platform supports and further having an aperture therethrough the second substrate being mounted on the surface of the first substrate, the second substrate having a second set of contacts in electrical communication with a second group of electronic components mounted on a top surface of the second substrates whereby the second substrate is situated between the first and second group of electronic components; and a plurality of wire bonds individually connected between respective pairs of contacts between the first and second sets of contacts, wherein the plurality of wire bonds are partially disposed within the aperture formed through the second substrate.

15. The electronics module of claim 1, wherein the aperture is formed as a rectangular slot.

16. The electronics module of claim 1, further comprising a protective cover attached to the top surface of the second substrate.

17. The electronics module of claim 1, wherein the first and second substrates are made of ceramic material.

18. A method of constructing a vertically stacked electronic circuit module for use in a cardiac stimulation device comprising the following steps:

providing a first substrate for mounting a first group of electrical components on a top surface thereon;

providing a second substrate characterized by an aperture therethrough;

attaching the second substrate to the top surface of the first substrate, the second substrate comprising platform supports for contacting the first substrate, a bottom surface resting on the platform supports and elevated above the first substrate, and a top surface for mounting a second group of electrical components thereon;

connecting at least one wire bond between at least one contact of the first group of electrical components and at least one contact of the second group of electrical components wherein the at least one wire bond traverses the aperture of the second substrate to form a vertically stacked interconnected circuit; and attaching a cover to the top surface of the second substrate for confining the first and second groups of electrical components.

19. The method of constructing a vertically stacked electronic circuit module of claim 18, wherein the at least one contact from the first and second groups of electrical components each comprise a respective row of contacts, and wherein the step of connecting at least one wire bond comprises the step of connecting a plurality of wire bonds between individual contacts of the respective rows of contacts.

20. The method of constructing a vertically stacked electronic circuit module of claim 18, wherein the aperture is formed as an elongated slot for accommodating a row of wire bonds therethrough.

21. The method of constructing a vertically stacked electronic circuit module of claim 18, wherein the first and second group of electrical components each comprise at least one integrated circuit, and wherein the at least one contact of the first group of electrical components is formed on the top surface of the first substrate and the at least one contact of the second group of electrical components is formed on the top surface of the second substrate.

22. The method of constructing a vertically stacked electronic circuit module of claim 18, wherein the cover is made of plastic.

* * * * *